(12) United States Patent
Umeda et al.

(10) Patent No.: US 8,815,637 B2
(45) Date of Patent: Aug. 26, 2014

(54) CONDUCTIVE PASTE FOR PHOTOVOLTAIC CELL AND METHOD OF PRODUCING PHOTOVOLTAIC CELL ELEMENT USING THE SAME

(75) Inventors: Kotaro Umeda, Amagasaki (JP); Tomoko Yoshimi, Higashiomi (JP); Shuhei Katayama, Prague (CZ); Yoshio Miura, Higashiomi (JP); Toshihiro Iwaida, Omihachiman (JP); Takeshi Nakatani, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/824,879

(22) PCT Filed: Sep. 30, 2011

(86) PCT No.: PCT/JP2011/072602
§ 371 (c)(1),
(2), (4) Date: Mar. 18, 2013

(87) PCT Pub. No.: WO2012/043811
PCT Pub. Date: Apr. 5, 2012

(65) Prior Publication Data
US 2013/0203206 A1    Aug. 8, 2013

(30) Foreign Application Priority Data

Sep. 30, 2010  (JP) .................................. 2010-220554
Jan. 26, 2011  (JP) .................................. 2011-014256

(51) Int. Cl.
*H01L 21/00*        (2006.01)

(52) U.S. Cl.
USPC ............... 438/98; 438/78; 252/506; 252/514; 252/512

(58) Field of Classification Search
CPC .................................................. H01L 51/5203
USPC ....................... 438/72, 98; 252/506, 514, 512
See application file for complete search history.

(56) References Cited

U.S. PATENT DOCUMENTS

2005/0085393 A1    4/2005   Nakao et al.

FOREIGN PATENT DOCUMENTS

| JP | 2007-234625 A | 9/2007 |
|----|---------------|--------|
| JP | 2008-32753 A  | 2/2008 |
| JP | 2008-135565 A | 6/2008 |
| JP | 2009-187695 A | 8/2009 |
| JP | 2009-187788 A | 8/2009 |
| JP | 2009-246277 A | 10/2009 |

OTHER PUBLICATIONS

International Search Report issued by Japan Patent Office for International Application No. PCT/JP2011/072602.

*Primary Examiner* — Mark A Laurenzi
(74) *Attorney, Agent, or Firm* — Procopio, Cory, Hargreaves & Savitch LLP (57) ABSTRACT

A conductive paste for a photovoltaic cell and a method for producing the photovoltaic cell are disclosed. The conductive paste includes a silver powder, glass frit and a sintering inhibitor that suppresses sintering of the silver powder. The sintering inhibitor contains at least one substance selected from aluminum oxide, silicon oxide and silicon carbide. The method includes forming a first anti-reflective layer on a first region of a main surface of a semiconductor substrate; forming a second anti-reflection layer on a second region of the main surface which is different from the first region; coating the electrically conductive paste onto the second anti-reflective layer on the second anti-reflection layer; and forming a surface electrode in the second region by reacting the second anti-reflection layer with the electrically conductive paste at an elevated temperature.

9 Claims, 3 Drawing Sheets

CONDUCTIVE PASTE FOR PHOTOVOLTAIC CELL AND METHOD OF PRODUCING PHOTOVOLTAIC CELL ELEMENT USING THE SAME

FIELD OF ART

The present invention relates to an electrically conductive paste for a photovoltaic cell, and to a method of producing a photovoltaic cell element that includes a step of coating the paste onto a semiconductor base and firing the coated paste.

BACKGROUND ART

Conventionally, screen printing has generally been used to form electrodes of a photovoltaic cell element by coating a paste for forming the electrode onto a semiconductor substrate made of a silicon or the like having a p-n junction, and firing in an oxidizing atmosphere. The paste used is one in which a metal powder, glass frit, an organic vehicle, and the like are mixed and made into a condition that enables screen printing (refer to, for example, Japanese Laid-open Patent Publication No. 2009-246277).

However, when forming an electrode on the semiconductor substrate, if there is a small amount of glass frit in the paste, there tends to be poor contact between the semiconductor substrate and the electrode. On the other hand, if there is a lot of glass frit, cracking tends to occur in the surface of the semiconductor substrate below the electrode, and the electrode tends to peel away, starting from the point of the crack, in subsequent process steps.

SUMMARY OF INVENTION

The present invention was made in consideration of the above-noted problems and has a main object to provide an electrically conductive paste for a photovoltaic cell that can reduce the occurrence of poor contact and cracking at the time of forming the electrode, and a method for producing a photovoltaic cell element that uses the paste.

The electrically conductive paste for a photovoltaic cell according to one aspect of the present invention is a paste that includes a silver powder, glass frit, and a sintering inhibitor that inhibits sintering of the silver powder, wherein the sintering inhibitor includes at least one substance selected from among alumina, silicon oxide, and silicon carbide.

A method for producing a photovoltaic cell element according to one aspect of the present invention is a method for producing a photovoltaic cell element provided with an electrode on a semiconductor substrate, wherein the forming of the electrode includes a coating step of coating the electrically conductive paste for a photovoltaic cell onto the semiconductor substrate and a step of firing the coated electrically conductive paste for a photovoltaic cell to form an electrode layer on the semiconductor substrate.

Furthermore, a method for producing a photovoltaic cell element according to one aspect of the present invention is a method for producing a photovoltaic cell element having a semiconductor base, an anti-reflection layer disposed in a first region on a main surface of the semiconductor base, and a surface electrode disposed in a second region on the main surface of the semiconductor base, the method having an anti-reflection layer forming step for forming an anti-reflection layer over the first region and the second region of the semiconductor base, a coating step for coating the electrically conductive paste for a photovoltaic cell onto the anti-reflection layer corresponding to the second region of the semiconductor base, and a firing step firing the electrically conductive paste for a photovoltaic cell and removing the anti-reflection layer positioned below the electrically conductive paste for a photovoltaic cell, so as to dispose the anti-reflection layer in the first region of the semiconductor base and form the surface electrode in the second region of the semiconductor base.

According to the above-noted electrically conductive paste for a photovoltaic cell and method for producing a photovoltaic cell that uses the electrically conductive paste for a photovoltaic cell, because it is possible at the time of electrode formation to reduce poor contact between the electrode and the semiconductor base such as a silicon substrate and possible to reduce the occurrence of cracking, beneath the electrode, at the surface of the semiconductor base such as a silicon substrate, it is possible to reduce the failure rate when producing photovoltaic cell elements, and to provide photovoltaic cell elements with high reliability.

BRIEF DESCRIPTION OF DRAWINGS

Exemplary embodiments of an electrically conductive paste for a photovoltaic cell (hereinafter referred to simply as paste) and a method for producing a photovoltaic cell that uses the paste according to the present invention will be described in detail below, with references being made to the drawings.

<Basic Constitution of the Paste>

The paste for forming an electrode of a photovoltaic cell element used in the present embodiment includes a silver powder, glass frit, and a sintering inhibitor that inhibits sintering of the silver powder. Specifically, the paste includes, in addition to a silver powder, glass frit, and an organic vehicle, a sintering inhibitor powder that includes at least one substance selected from among aluminum oxide, silicon oxide, and silicon carbide.

In this case, a powder of balls having an average diameter of 0.1 to 5.0 µm or flakes of approximately the same size can be used as the silver powder.

By inhibiting sintering of the silver powder when the paste for forming the electrode is fired, the sintering inhibitor produces an effect of relieving stress at the surface of the semiconductor base such as a silicon substrate on which the electrode is provided. Additionally, the sintering inhibitor is a substance that does not decompose or melt at a firing temperature of the paste, and in particular it is possible to use a powder of $Al_2O_3$, which is aluminum oxide, $SiO_2$, which is silicon oxide, SiC, which is silicon carbide, or the like. As will be described later, in particular the use of the $Al_2O_3$ powder or the $SiO_2$ powder is preferred, because the adhesion between the electrode formed by firing the paste coated onto to a semiconductor base and the semiconductor base is better than when other materials are used.

It is preferable that the mass amount of sintering inhibitor included be at least 1% and no greater than 35% with respect to the total included mass amount of the silver powder and glass frit in the paste (meaning at least 1 and no greater than 35 with respect to a total mass amount of 100 of silver powder and glass frit). The reason for this that, by making the included mass amount be within this numerical range, it is possible to exhibit a sufficient sintering inhibition effect and reduce the occurrence of cracking at the surface of a semiconductor base such as a silicon substrate. Another reason is that there is good contact resistance between the electrode and the semiconductor base such as a silicon substrate.

It is also preferable that the average particle diameter of the sintering inhibitor included in the paste be at least 0.1 µm and no greater than 5 µm. The reason for this is that, by making the average particle diameter be within this numerical range, it is possible to exhibit a sufficient sintering inhibition effect and to reduce the occurrence of cracking at the surface of a semiconductor base such as a silicon substrate, and also it is possible to have a good screen printing characteristics and to obtain easily the desired electrode shape.

Additionally, it is preferable that the mass amount of the glass frit be at least 1% and no greater than 30% with respect to the included mass amount of silver powder in the paste for electrode formation in the present embodiment (meaning at least 1 and no greater than 30 with respect to a mass amount of 100 of silver powder). In particular, if the thickness of the electrode is to be made thin (an average thickness of 10 µm or less), it is preferable that the above-noted mass amount be at least 11% and no greater than 30% with respect to the included mass amount of silver powder. The reason for this is that, by making the included mass amount be within this numerical range, it is difficult for poor contact to occur between the electrode and the semiconductor base such as a silicon substrate, and the contact resistance is good between the electrode and the semiconductor base.

As the glass frit included in the paste, it is possible to use a material, for example, that contains an $SiO_2$—$Bi_2O_3$—$PbO$ based, $B_2O_3$—$SiO_2$—$Bi_2O_3$ based, or $B_2O_3$—$SiO_2$—$PbO$ based glass, or a $Bi_2O_3$—$SiO_2$—$ZnO$ based glass, in which glass substantially $B_2O_3$ is not contained. The term substantially not contained in this case means, for example, less than 0.1 mass %, and this will be the same in the descriptions to follow.

As the organic vehicle included in the paste it is possible, for example, one to use ethyl cellulose, an acrylic resin, an alkyd resin, or the like dissolved in a solvent.

<Basic Constitution of the Photovoltaic Cell Element>

Figure 1:
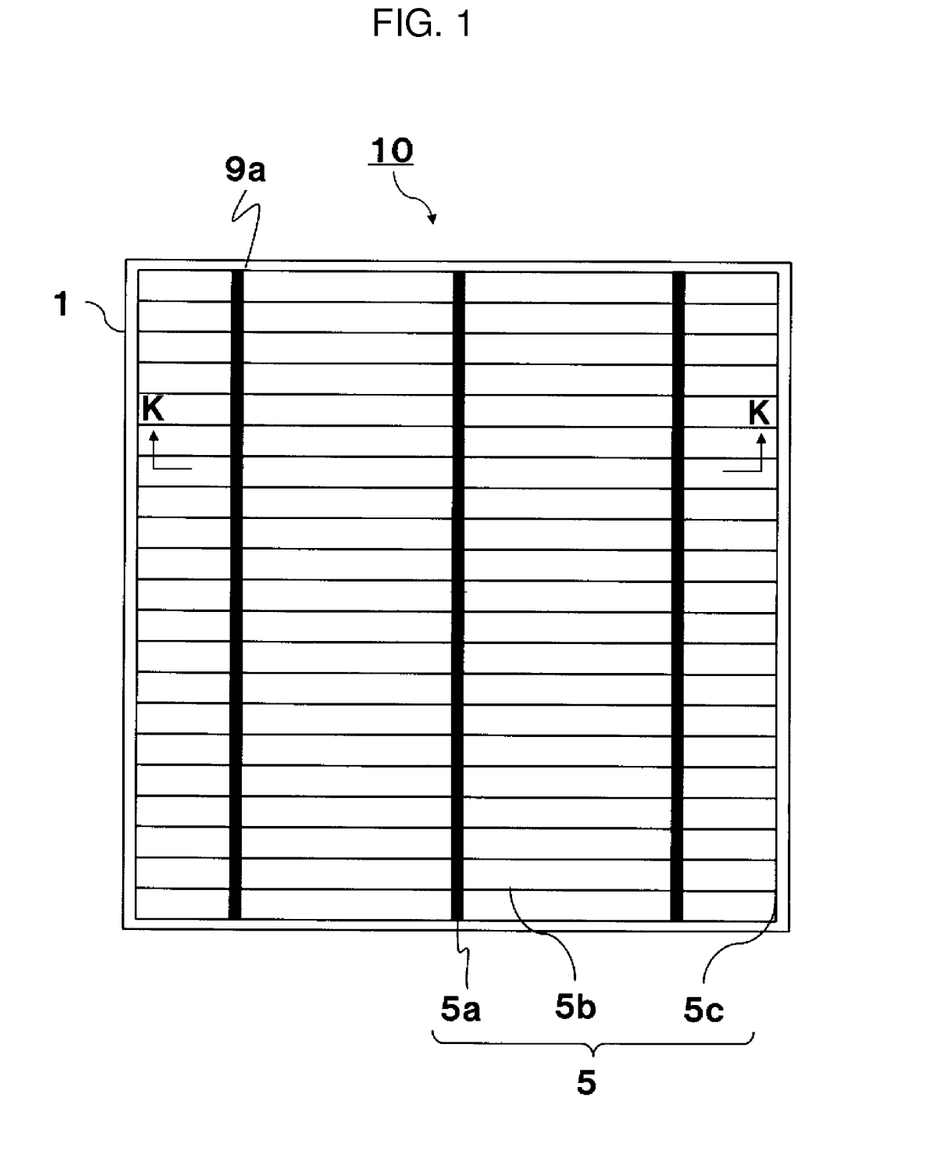
FIG. 1 is a plan view of one example of a photovoltaic cell element using an electrically conductive paste for a photovoltaic cell according to one aspect of the present invention, seen from a first surface side of the semiconductor base.
Figure 2:
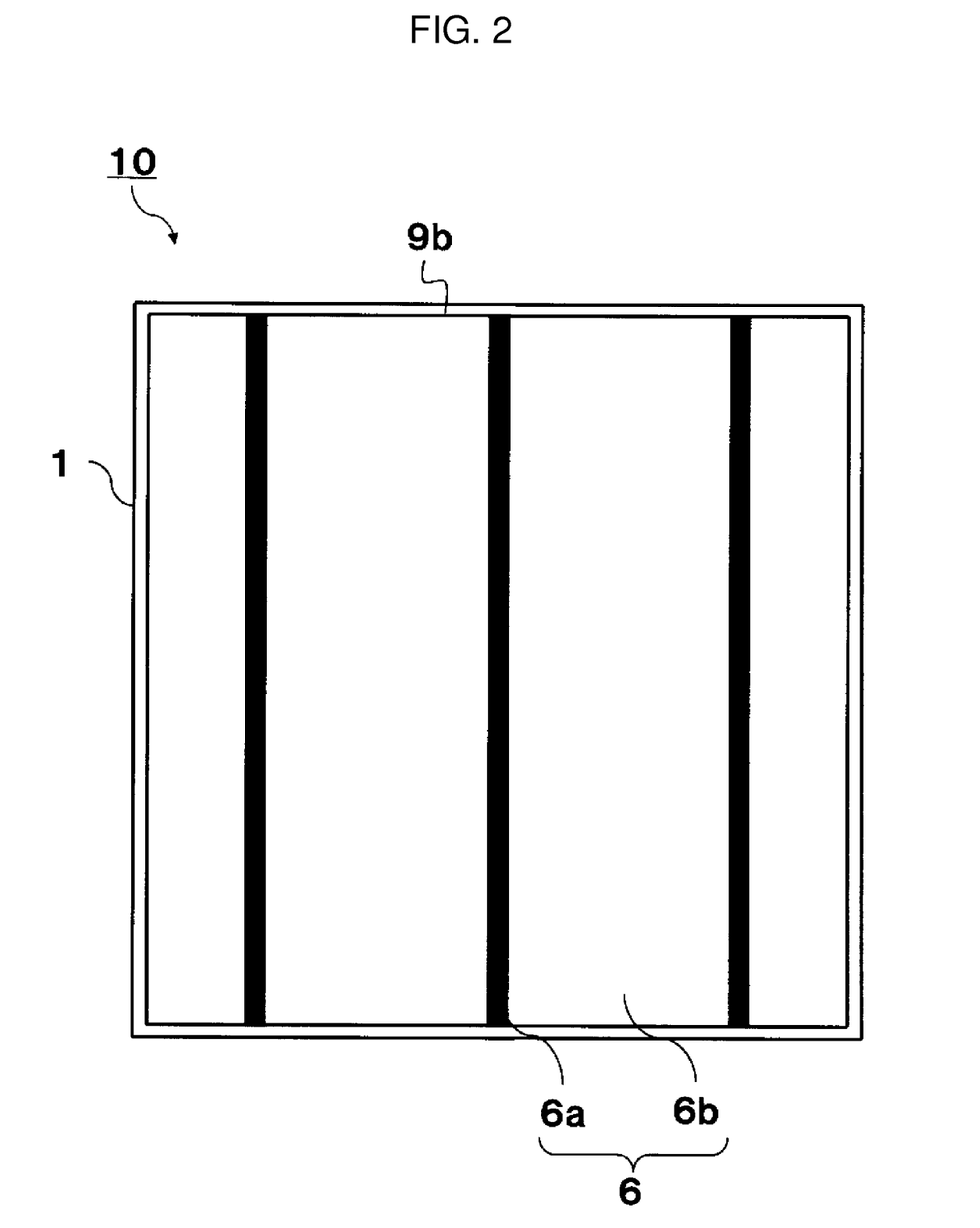
FIG. 2 is a plan view of one example of a photovoltaic cell element using an electrically conductive paste for a photovoltaic cell according to one aspect of the present invention, seen from a second surface side of the semiconductor base.
Figure 3:
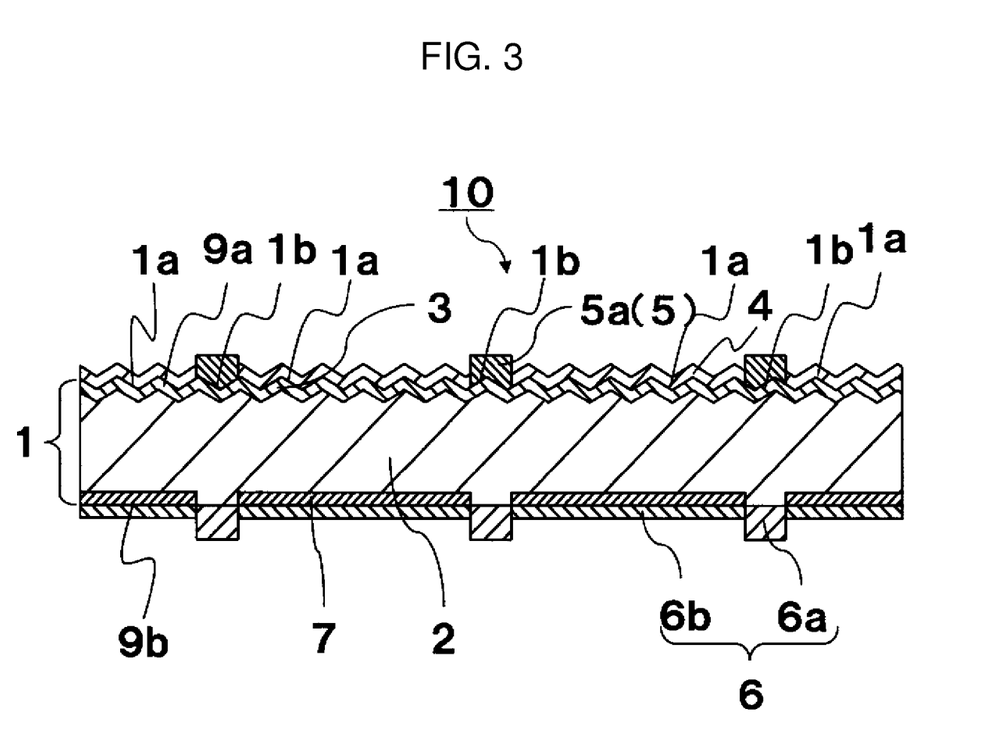
FIG. 3 is a cross-sectional view of one example of a photovoltaic cell element using an electrically conductive paste for a photovoltaic cell according to one aspect of the present invention, along the line K-K in FIG. 1.

The basic constitution of a photovoltaic cell element will now be described. As shown in FIGS. 1 to 3, the photovoltaic cell element 10 includes a light-receiving surface to which light is incident (the upper surface in FIG. 3, hereinafter referred to as the first surface) 9a, and a non-light receiving surface that corresponds to the rear surface of the first surface 9a (the lower surface in FIG. 3, hereinafter referred to as the second surface) 9b.

The photovoltaic cell element 10 includes a first semiconductor layer 2 that is a semiconductor layer of one conductivity type and a second semiconductor layer 3 that is a semiconductor layer of the reverse conductivity type provided on the first surface 9a side in the first semiconductor 2, and an anti-reflection layer 4 that is provided on the first surface 9a of the semiconductor 1.

The photovoltaic cell element 10 also includes a first electrode 5 that is provided on the first surface 9a of the semiconductor substrate 1, and a second electrode 6 that is provided on the second surface 9b of the semiconductor substrate 1.

A crystalline silicon substrate such as a single-crystal silicon substrate or a polycrystalline silicon substrate that includes a prescribed dopant element (an impurity for controlling the type of conductivity) and exhibits one conductivity type (for example p-type), for example, is preferably used as the semiconductor substrate 1.

Because a photovoltaic cell element generally uses a sheet-like semiconductor base, although the following will describe a semiconductor base as an example, the semiconductor base is not restricted to being sheet-like.

<Specific Example of a Photovoltaic Cell Element>

Next, a more specific example of a photovoltaic cell element will be described. As a semiconductor substrate 1 that constitutes a first semiconductor layer 2 having one type of conductivity (for example, p-type), it is preferable to use a crystalline silicon substrate such as a single-crystal silicon substrate or a polycrystalline silicon substrate. The resistivity of the semiconductor substrate 1 is approximately 0.2 to 2.0 Ω-cm. The thickness of the semiconductor substrate 1 is preferably, for example, 250 µm or less, and further preferably 150 µm or less. Although the shape of the semiconductor substrate 1 is not restricted, as illustrated, making the shape quadrangule is preferable from the standpoint of manufacturing, configuring a photovoltaic cell module having an arrangement of a large number of photovoltaic cell elements, and the like.

An example of using a crystalline silicon substrate exhibiting p-type conductivity as the semiconductor substrate 1 will be described. To have the semiconductor substrate 1, which is a crystalline silicon substrate, exhibit p-type conductivity, boron or gallium, for example, is preferable to use as a dopant element.

The second semiconductor layer 3, which forms a p-n junction with the first semiconductor layer 2, is a layer exhibiting a conductivity that is the reverse of that of the first semiconductor layer 2 (semiconductor substrate 1), and is provided on the first surface 9a side in the first semiconductor layer 2. In the case in which the first semiconductor layer 2 exhibits p-type conductivity, the second semiconductor layer 3 is formed so as to exhibit n-type conductivity. In silicon substrate in which the semiconductor substrate 1 exhibits p-type conductivity, in the case in which, for example, the second semiconductor layer 3 is formed within the surface layer of the semiconductor substrate 1, the second semiconductor layer 3 can be formed by causing diffusion of an impurity such as phosphorus or the like, on the first surface 9a side of the semiconductor substrate 1.

The anti-reflection layer 4 reduces the light reflectivity in a desired wavelength region, thereby achieving the role of increasing the amount of photogenerated carriers. The anti-reflection layer 4 is made, for example, of a silicon nitride film, a titanium oxide film, a silicon oxide film, a magnesium oxide film, a tin indium oxide film, a tin oxide film, a zinc oxide film, or the like. The thickness of the anti-reflection layer 4 is selected as appropriate to the materials used, this being set so as to create the non-reflection condition with respect to an appropriate incident light. For example, in a semiconductor substrate 1 made of silicon, a refractive index of approximately 1.8 to 2.3 and a thickness of approximately 500 to 1200 Å are preferable. If an anti-reflection layer 4 is made of a silicon nitride film, it preferably has a passivation effect.

A BSF (back-surface-field) region 7 provided on the second surface 9b side of the semiconductor substrate 1 has the role of reduction, which is caused by recombination of carriers in the vicinity of second surface 9b, in efficiency, and forms an internal electrical field on the second surface 9b side. The BSF region 7 exhibits the same type of conductivity as the first semiconductor layer 2, and includes a majority carrier concentration that is higher than that contained in the first semiconductor layer 2. This means that the dopant element exists with a concentration that is higher than that of the dopant element which is doped to exhibit the one conductivity type in the semiconductor substrate 1. If the semiconductor substrate 1 exhibits p-type conductivity, the BSF region 6 is preferably formed, for example, by causing diffusion of a dopant element such as boron or aluminum on the second surface 9b side, so that the concentration of these dopant elements is approximately $1\times10^{18}$ to $5\times10^{21}$ atoms/cm$^3$.

As shown in FIG. 1, the first electrode 5 includes a first output lead-out electrode 5a and a plurality of first linear collector electrodes 5b. A least one part of first output lead-out electrode 5a intersects with the first collector electrodes 5b. The first output lead-out electrode 5a has width of, for example, approximately 1.3 to 2.5 mm.

The first collector electrodes 5b are linear, have a width of approximately 50 to 200 μm, and are narrower than the first output lead-out electrode 5a. The plurality of the first collector electrodes 5b are provided with a mutual spacing therebetween of approximately 1.5 to 3 mm.

The thickness of such a first electrode 5 is approximately 10 to 40 μm. The first electrode 5 can be formed, for example, by coating a paste for electrode formation made of glass frit and an organic vehicle or the like using screen printing in a desired shape, after which it is fired. In the present embodiment, because a sintering inhibitor powder of $Al_2O_3$ or the like is contained in the electrode formation paste, particles of $Al_2O_3$ are dispersed within the first electrode 5. By doing this, it is possible when the electrode is formed to reduce poor contact between the electrode and the silicon substrate, and reduce the occurrence of cracking in the surface of the silicon substrate beneath the electrode.

In a particularly preferable embodiment, the first electrode 5 is constituted by an underlying electrode layer formed as described above and a plated electrode layer, which is an electrically conductive layer formed by plating thereover. A material appropriately selected from among copper, silver, and tin or the like is preferable for use as the material of the plated electrode, and it is preferable that the thickness of the underlying electrode layer be made 1 to 10 μm and the thickness of the plated electrode layer be made 5 to 30 μm. The underlying electrode layer is formed by coating the electrode formation paste, after which it is fired. For this reason, the porosity of the underlying electrode layer is 5% or greater. In contrast, because the plated electrode layer is formed so as to have a porosity of 5% or less, by making the thickness of the underlying electrode layer thin, 10 μm or less, and preferably 8 μm or less, it is possible to reduce the linear resistance of the first electrode 5 while maintaining its overall thickness.

In the formation of the first electrode 5, although the glass frit that is melted during firing is held, thereby improving the adhesion strength of the electrode, many of the glass components in the glass frit tend to exist at the interface with the semiconductor substrate. In the present embodiment, it is particularly preferable that $Al_2O_3$ or $SiO_2$ be used as the sintering inhibitor added to the electrode formation paste. Because $Al_2O_3$ has better wettability with the glass components than does silver and is easily adsorbed onto the glass, a part of the glass components melted during firing remains within the electrode and couples with the glass components existing at the semiconductor substrate interface, thereby contributing to the improvement of the adhesion strength of the electrode. This effect is particularly prominent if the thickness of the underlying electrode layer is made small. Also, because the main component of $SiO_2$ is silicon, even if part thereof diffuses in the semiconductor substrate, it is possible to reduce the influence on the characteristics.

As the glass frit used in the electrode formation paste, as will be described later, the use of a $Bi_2O_3$-based glass and the addition of $Al_2O_3$ to the paste are particularly preferable, because this improves the various characteristics of the photovoltaic cell element after firing the paste. This is thought to be because, $Al_2O_3$ having better wettability with glass components than does silver and tending to adsorb onto glass when baking, the amount of glass frit reaching the interface with the semiconductor substrate 1 is reduced, so that there is a reduction in the damage to the second semiconductor layer 3 by glass frit breaking through to the second semiconductor layer 3. The term $Bi_2O_3$-based glass means the inclusion of at least 50 mass % of $B_2O_3$ with respect to the total of the glass frit components. For example, the included amount with respect to the overall glass frit taken as 100 would be 50 to 90 mass % of $Bi_2O_3$, 0 to 10 mass % of $SiO_2$, 0 to 15 mass % of ZnO, and 0 to 10 mass % of $B_2O_3$, with other components ($ZrO_2$, BaO, MgO, CaO, $TiO_2$, $Cr_2O_3$, $Fe_2O_3$, $Al_2O_3$, CuO and/or $P_2O_5$ or the like) being 0 to 15 mass %.

As the glass frit using in the electrode formation paste, as will be described later, in particular one having $Bi_2O_3$—$SiO_2$—ZnO-based glass and in which glass there is a substantially no $B_2O_3$ included may be adopted, with the paste fired under the prescribed conditions. The reason for this is that, compared to one that includes $B_2O_3$, there is an improvement in various characteristics of the photovoltaic cell element after the paste is fired.

As shown in FIG. 2, the second electrode 6 includes a second output lead-out electrode 6a and a second collector electrode 6b. The thickness of the second output lead-out electrode 6a in the present embodiment is approximately 10 to 30 μm and the width thereof is approximately 1.3 to 7 mm. The second output lead-out electrode 6a can be formed by the same material as and by the same method as the above-described first electrode 5. For example, formation is possible by coating a silver paste in a desired shape and then baking. The second collector electrode 6b has a thickness of approximately 15 to 50 μm and is formed over substantially the overall surface of the second surface 9b of the semiconductor substrate 1, with the exception of a part of the second output lead-out electrode 6a. The second collector electrode 6b can be formed by coating, for example, an aluminum paste in a desired shape and then firing the paste.

<Method for Producing a Photovoltaic Cell Element>

The method for producing a photovoltaic cell element 10 according to the present embodiment will be described as follows.

First, basically the process in the case of forming an electrode on the semiconductor substrate 1 such as a silicon substrate includes a coating process step for coating the above-described paste onto the semiconductor substrate 1, and a firing step for firing the coated paste to form the electrode layer on the semiconductor substrate 1.

As shown in FIG. 1, in the case of producing a photovoltaic cell element 10 that includes a semiconductor substrate 1 such as a silicon substrate, an anti-reflection layer 4 disposed in a first region 1a on the main surface of the semiconductor substrate 1, and a first electrode 5, which is a surface electrode disposed in a second region 1b of the main surface of the semiconductor substrate 1, there are the following process steps. Specifically, these are an anti-reflection layer formation process step for forming an anti-reflection layer 4 in the first region 1a and the second region 1b of the semiconductor substrate 1, a coating process step for coating the above-described paste onto the anti-reflection layer 4 corresponding to the second region 1b of the semiconductor substrate 1, and a firing process step for firing the coated paste and removing the anti-reflection layer 4 positioned below the paste, so as to dispose the anti-reflection layer 4 in the first region 1a of the semiconductor substrate 1 and form the first electrode 5 in the second region 1b of the semiconductor substrate 1.

In this case, in the above-noted firing process step, it is preferable that the thickness of the above-noted electrode layer be 10 μm or less. It is also preferable that, after the above-noted firing process step, a plating process step is performed by laminating a conductive layer over the formed electrode layer or first electrode 5.

Next, a more specific method for production will be described. First, the semiconductor substrate 1 constituting the first semiconductor layer 2 is prepared as the semiconductor base. In the case of using a single-crystal silicon substrate as the semiconductor substrate 1, formation is done by, for example, the pulling method, and in the case of using a polycrystalline silicon substrate as the semiconductor substrate 1, formation is done by, for example, casting. In the following, the example of using p-type polycrystalline silicon will be described.

First, a polycrystalline silicon ingot is fabricated using, for example, casting. Next, the ingot is sliced to a thickness of, for example, 250 μm or less. After that, in order to remove the mechanically damaged layer and contaminated layer at the cut cross-section of the semiconductor substrate 1, it is desirable that a removal process step be performed by subjecting the surface to a very small amount of etching, using an aqueous solution of NaOH, KOH, or fluoronitric acid. It is further desirable after this etching processing step to use wet etching or dry etching to form a microtextured structure on the surface of the semiconductor substrate 1. Depending upon the conditions for forming the texture, the process step of removing the above-noted damage can be omitted.

Next, an n-type second semiconductor layer 3 is formed within the surface layer on the first surface 9a side of the semiconductor substrate 1. A second semiconductor layer 3 such as this is formed by a method such as the method of coating and thermal diffusion, in which $P_2O_5$ that has been made into a paste is coated onto the surface of the semiconductor substrate 1 and thermally diffused, the vapor-phase thermal diffusion method in which gaseous phosphorus oxychloride ($POCl_3$) is used as the diffusion source, and the ion implantation method, whereby direct diffusion of phosphorus ions is done. The second semiconductor layer 3 is formed with a thickness of approximately 0.2 to 2 μm, and a sheet resistance of approximately 40 to 150 Ω/square. The method of forming the second semiconductor layer 3 is not restricted to being one of the above-noted methods, and formation may be done, for example, using thin-film technology to form a crystalline silicon film that includes a hydrogenated amorphous silicon film or a microcrystalline silicon film or the like. Additionally, an i-type silicon region may be formed between the semiconductor substrate 1 and the second semiconductor layer 3.

Next, in the case in which the second semiconductor layer 3 is formed on the second surface 9b side, the second surface 9b side only is removed by etching, so as to expose a p-type conductivity region. For example, the second surface 9b side only of the semiconductor substrate 1 is immersed in a hydrofluoric acid solution to remove the second semiconductor layer 3. After that, phosphorus glass that attaches to the surface of the semiconductor substrate 1 when forming the second semiconductor layer 3 is removed by etching. The same type of structure can be formed by a process of forming a diffusion mask on the second surface 9b side beforehand and forming the second semiconductor layer 3 by vapor-phase thermal diffusion method or the like, followed by removal of the diffusion mask.

By the above, a semiconductor substrate 1 having a first semiconductor layer 2 that includes a p-type conductivity layer and a second semiconductor layer 3 can be prepared.

Next, the anti-reflection layer 4 is formed over the first region 1a and the second region 1b which are over a main surface of the semiconductor substrate 1. The anti-reflection layer 4 is formed by, for example, a method such as PECVD (plasma-enhanced chemical vapor deposition), vapor deposition, or sputtering. For example, in the case in which an anti-reflection layer 4 made of a silicon nitride film is formed by PECVD, with the temperature within a reaction chamber of 500° C., a gas mixture of silane ($SiH_4$) and ammonia ($NH_3$) is diluted by nitrogen ($N_2$) and a plasma is formed thereof by glow discharge decomposition to cause deposition.

Next, a BSF region 7 into which a high concentration of a semiconductor impurity of one conductivity type had been diffused is formed on the second surface 9b side of the semiconductor substrate 1. As the method for production, for example, it is possible to use the method of thermal diffusion using boron tribromide ($BBr_3$) as the diffusion source for formation at a temperature of 800 to 1100° C., or the method of coating an aluminum paste made of aluminum powder and an organic vehicle or the like using screen printing, followed by heat treating (baking) at a temperature of approximately 600 to 850° C. to cause diffusion of aluminum into the semiconductor substrate 1. Using the method of printing and then firing the aluminum paste, it is possible to form a desired diffusion region on only the printed surface, so that it is not necessary to remove the n-type second semiconductor layer that is formed on the second surface 9b also simultaneously with the formation of the second semiconductor layer 3. Also, a laser beam or the like can be used only in the peripheral part of the second surface 9b side to perform p-n separation (separation of the p-n junction continuous region). The method for forming the BSF region 7 is not restricted to the above methods. For example, using thin-film technology, formation is possible of a crystalline silicon film or the like that includes a hydrogenated amorphous silicon film or a microcrystalline silicon film. Additionally, an i-type silicon region may be formed between the first semiconductor layer 2 and the third semiconductor layer 4.

Next, the first electrode 5 (first output lead-out electrode 5a and first collector electrode 5b) and the second electrode 6 (second output lead-out electrode 6a and second collector electrode 6b) are formed in the second region 1b of the semiconductor substrate 1 as follows.

The first electrode 5 is fabricated using an electrically conductive paste that includes a silver powder, an organic vehicle, glass frit, and a sintering inhibitor (for example, $Al_2O_3$, $SiO_2$, or SiC). The electrically conductive paste is coated onto the anti-reflection layer 4 that corresponds to the second region 1b, which is the first surface 9a of the semiconductor substrate 1. After that, by firing for a period of several tens of seconds to several tens of minutes at a highest temperature of 600 to 850° C., the fire-through method is used to break through the anti-reflection layer 4 and to form the underlying electrode layer of the first electrode 5 over the second region 1b of the semiconductor substrate 1. Screen printing or the like can be used as the coating method. After this coating, it is preferable that the solvent is vaporized at a prescribed temperature to cause drying. By the fire-through method, the glass frit reacts with the anti-reflection layer 4 at a high temperature. By doing this, the underlying electrode layer makes contact with the semiconductor substrate 1. When this occurs, because $Al_2O_3$ that is added as a sintering inhibitor in particular has better wetting with the glass components than that of silver and tends to adsorb to the glass at the time of baking, a part of the glass components fused during firing remains, joining with the glass components existing at the interface with the semiconductor substrate contributing to the improvement in the adhesion strength of the electrode.

Next, plating is used to form a plated electrode layer over the underlying electrode. By doing this, the first output lead-out electrode 5a and the first collector electrode 5b are formed. The specific plating method will now be described. First, the semiconductor substrate 1 is immersed in a plating bath that holds plating fluid. An anode made of a metal member with respect to the electroplating liquid is provided within the plating bath. The semiconductor substrate 1 which is provided with the underlying electrode layer that is the object to be plated serves as the cathode. A voltage is applied between the anode and the cathode so as to cause current to flow, thereby forming a plated electrode layer, which is an electrically conductive layer, over the underlying electrode layer.

Copper, silver, or tin or the like is used as the plated electrode layer. When this is done, the electroplating liquid that is used is a plating liquid that contains the metal that is to constitute the plated electrode layer, and a plate of a metal that will constitute the plating layer is used as the metal member of the anode. The anode may be a non-soluble metal member, and titanium coated with iridium oxide or titanium coated with platinum or the like is used. For example, in the case of a plated electrode layer of copper, a copper sulfate plating liquid, a cupric pyrophosphate plating liquid, or a copper cyanide plating liquid or the like is used as the electroplating liquid. A copper plate that contains phosphorus and copper is used as the metal member of the anode.

Next, the second electrode 6 will be described. First, the second collector electrode 6b is fabricated using an aluminum paste that contains, for example, an aluminum powder and an organic vehicle. This paste is coated over substantially the entire surface of the second surface 9b, with the exception of a part in which the second output lead-out electrode 6a is formed. Screen printing or the like can be used as the coating method. After coating the paste in this manner, it is preferable that the solvent is vaporized at a prescribed temperature to cause drying, so that it is difficult for the paste to become attached to other parts during work.

Next, the second output lead-out electrode 6a is fabricated using a silver paste that contains a metal power made of, for example, a silver powder, an organic vehicle, and glass frit. The silver plate is coated in a pre-established shape. By coating the silver paste in a position at which it makes contact with a part of the aluminum paste, there is a partial overlapping between the second output lead-out electrode 6a and the second collector electrode 6b. Screen printing or the like can be used as the coating method. After the coating, it is preferable that the solvent be vaporized at a prescribed temperature to cause drying.

Then, the semiconductor substrate 1 is fired in a firing oven at a highest temperature of 600 to 850° C. for a period of several tens of seconds to several tens of minutes, so that the second electrode 6 is formed on the second surface 9b side of the semiconductor substrate 1.

Although printing and firing of the second electrode 6 is used to form the electrodes, it is also possible to form a thin film by vapor deposition or sputtering or the like, or by plating.

By performing the above, it is possible to fabricate a high-reliability photovoltaic cell element 10, with a reduction of the occurrences of poor intimate contact between the silicon substrate and the electrodes and cracking of the silicon substrate surface beneath the electrodes at the time of electrode formation.

VARIATION EXAMPLES

The present invention is not restricted to the above-noted embodiment, and can be subjected to many corrections and changes, within the scope thereof, as follows.

For example, a passivation film may be provided on the second surface 9b side of the semiconductor substrate 1. This passivation film has the role of reducing carrier recombination at the second surface 9b, which is the rear surface of the semiconductor substrate 1. A silicon nitride film, a silicon oxide film, or a titanium oxide film can be used as the passivation film. The thickness of the passivation film can be made approximately 100 to 2000 Å, and the passivation film can be formed by PECVD, vapor deposition, or sputtering or the like. For this reason, the structure used for the second surface 9b side of the semiconductor substrate 1 can be a second surface 9b side structure used in PERC (passivated emitter and rear cell) structure or a PERL (passivated emitter rear locally diffused) structure.

A linear auxiliary electrode 5c that intersects with the first collector electrode 5b may be formed at both end parts that intersect with respect to the longitudinal direction of the first collector electrode 5b, and it is possible to cause the current that is supplied in plating to flow in the first electrode 5 uniformly, enabling formation of a plated electrode layer having a uniform thickness. This is preferable, because, even if there is a break in a part of the line of a first collector electrode 5b, the increase in the resistance is reduced, and it is possible to cause the current to flow to the output lead-out electrode 5a via another first collector electrode 5b.

Also, in the same manner as the first electrode 5, the second electrode 6 may be formed in a shape that includes the second output lead-out electrode 6a and a plurality of linear second collector electrodes 6b that intersect with the second output lead-out electrode 6a, and an underlying electrode layer and a plated electrode layer may be formed therein.

It is preferable that a fourth semiconductor layer having the same conductivity type as the second semiconductor layer and having a thickness that is greater than that of the second semiconductor layer be formed at the position at which the first electrode 5 is formed. When this is done, the fourth semiconductor layer is formed to have a sheet resistance that is lower than that of the second semiconductor layer. By forming the fourth semiconductor layer to have a large thickness, it is possible to reduce the contact resistance with the electrode. An example of a method for making the fourth semiconductor layer having a large thickness is formation of the second semiconductor layer by coating and thermal diffusion method or vapor-phase thermal diffusion method, followed by formation of the fourth semiconductor layer by irradiating a laser beam onto the semiconductor substrate 1 adjusted to the electrode shape of the first electrode 5 with phosphorus glass remaining, so as to cause re-diffusion of phosphorus from the phosphorus glass into the second semiconductor layer.

In addition to application to the above-described double-sided electrode type of photovoltaic cell element, the present invention can be applied to various types of photovoltaic cell elements, such as a back-contact type photovoltaic cell element.

EXAMPLES

Specific examples are described below. The drawings referenced are FIG. 1 to FIG. 3.

Example 1

First, a polycrystalline silicon substrate (the semiconductor substrate 1) having a thickness of 260 μm, an outer shape of 156 mm×156 mm, and a resistivity of 1.5 Ω-cm were prepared and the damaged layer at the surface of the silicon substrate was etched by an NaOH solution and washed.

Next, dry etching was used to form a texture on the first surface 9a. Then, vapor-phase thermal diffusion method, in which $POCl_3$ is used as a source in the diffusion process, was used to form the second semiconductor layer 3. When this was done, the sheet resistance of the second semiconductor layer 3 was 70 Ω/square. A hydrofluoric acid solution was used to remove phosphorus glass by etching, p-n separation was performed by a laser beam, and then a silicon nitride film to serve as the anti-reflection layer 4 was formed on the first surface 9a using PECVD.

Additionally, an aluminum paste was coated over the substantially entire surface of the second surface 9b of the semiconductor substrate 1, and fired to form the BSF region 7 and the second collector electrode 6b. A silver paste was coated over the first surface 9a and the second surface 9b and fired, and the underlying electrode layer and the second output lead-out electrode 6a were formed on the part to serve as the first electrode 5. In the part to become as the first electrode 5, plating was done to form a silver plated electrode layer over the underlying electrode layer, thereby forming the first electrode 5.

Screen printing was used to coat mixtures of a silver powder, $B_2O_3$—$SiO_2$—PbO-based glass frit, an organic vehicle, and a sintering inhibitor with the compositions of pastes No. 1 to No. 5 as shown in the Table 1 over the underlying electrode layer of the first electrode 5 provided on the first surface 9a of the semiconductor substrate 1, and the coated layer was fired for three minutes at a peak temperature of 850° C.

In Table 1, the amounts of glass frit indicate the mass amount % of the glass frit with respect to the total included mass amount (100%) of silver powder in the paste. The composition of the sintering inhibitor indicates the mass amount % of the sintering inhibitor with respect to the total included mass amount (100%) of the silver powder and the glass frit.

In the glass frit A used for each of the pastes Nos. 1 to 14, the included mass amount, with respect to the overall glass frit taken as 100%, was 75 mass % of $B_2O_3$, 7 mass % of $SiO_2$, and 13 mass % of PbO, with other components ($ZrO_2$, BaO, MgO, CaO, $TiO_2$, $Cr_2O_3$, $Fe_2O_3$, CuO and/or $P_2O_5$ or the like) being 5 mass %.

After that, an inner lead, in which the entire surface of the copper foil is covered by solder, was fused to the first output lead-out electrode 5a to obtain the photovoltaic cell element 10.

Next, a tensile strength tester was used to measure the adhesion strength of the first output lead-out electrode 5a with respect to the photovoltaic cell element 10. The measurement results are shown in Table 1.

TABLE 1

| Paste No. | Amount of glass frit (mass %) | Sintering Inhibitor Composition (mass %) | | | Adhesion strength (gf) |
|---|---|---|---|---|---|
| | | Amount of $Al_2O_3$ | Amount of $SiO_2$ | Amount of SiC | |
| 1 | 10 | — | — | — | 20 |
| 2 | 5 | 3 | — | — | 100 |
| 3 | 10 | 3 | — | — | 180 |
| 4 | 10 | 10 | — | — | 175 |
| 5 | 12 | 10 | — | — | 250 |
| 6 | 12 | — | 10 | — | 240 |
| 7 | 12 | — | — | 10 | 220 |
| 8 | 15 | 3 | — | — | 155 |
| 9 | 15 | 10 | — | — | 255 |
| 10 | 15 | 15 | — | — | 145 |
| 11 | 20 | 3 | — | — | 100 |
| 12 | 20 | 10 | — | — | 170 |
| 13 | 20 | 15 | — | — | 180 |
| 14 | 20 | 20 | — | — | 170 |

As is clear from Table 1, whereas in a paste No. 1, in which the sintering inhibitor was not added, the adhesion strength of the first output lead-out electrode 5a was only 20 gf, in the pastes Nos. 2 to 14, in which $Al_2O_3$, $SiO_2$ or SiC are added, respectively, as the sintering inhibitor, it was found that the adhesion strength between the formed first output lead-out electrode 5a and the semiconductor substrate 1 was greatly improved. The pastes Nos. 5 to 7, in which the amount of glass frit was 12 mass % and $Al_2O_3$, $SiO_2$ or SiC were added, respectively, as the sintering inhibitor, showed a high adhesion strength and, among those pastes, the paste No. 5 using $Al_2O_3$ as the sintering inhibitor showed highest adhesion strength. The case in which the paste No. 9 having 15 mass % of glass frit, and 10 mass % of $Al_2O_3$ as the sintering inhibitor was used showed the highest adhesion strength among the cases in which the pastes Nos. 1 to 14 were used.

Whereas in the case of the paste No. 1 without an added sintering inhibitor, the surface layer of the silicon substrate adhered to the inner lead so that the inner lead was peeled away from the first output lead-out electrode 5a, in the case of the pastes Nos. 2 to 14 in which $Al_2O_3$, $SiO_2$, or SiC, respectively was added as the sintering inhibitor, the silicon substrate cracked and the inner lead peeled away from the first output lead-out electrode 5a. When a crack occurs at the surface of the silicon substrate, because the silicon substrate does not crack and only the surface layer of the silicon substrate adheres to the inner lead, the surface at which cracking of the silicon substrate causes the inner lead to peel away from the first output lead-out electrode 5a, meaning that it was possible to reduce cracking at the surface of the silicon substrate.

Example 2

Next, whereas a $Bi_2O_3$ based glass was used as a glass frit in the paste to be used for the first electrode 5, a photovoltaic cell element using a paste to which the prescribed sintering inhibitor was added will be described as an example.

Because it was the same as the example 1, except mainly for the materials of the glass frit in the above-noted pastes and the formation by using only the above-noted paste without providing the silver plated electrode layer in the first electrode 5, the detailed description will be omitted.

Two kinds of glass frits that substantially included and did not include $B_2O_3$ in the glass were prepared.

In the glass frit B that substantially included $B_2O_3$ in the glass, the included mass amounts, with respect to the overall glass frit taken as 100 mass %, was 75 mass % of $Bi_2O_3$, 2 mass % of $SiO_2$, 11 mass % of ZnO, and 9 mass % of $B_2O_3$, with other components ($ZrO_2$, BaO, MgO, CaO, $TiO_2$, $Cr_2O_3$, $Fe_2O_3$, $Al_2O_3$, CuO and/or $P_2O_5$ or the like) being 3 mass %.

In the glass frit C that did not substantially included $B_2O_3$ in the glass, the included mass amounts, with respect to the overall glass frit taken as 100 mass %, was 81 mass % of $Bi_2O_3$, 5 mass % of $SiO_2$, and 5 mass % of ZnO, with other components ($ZrO_2$, BaO, MgO, CaO, $TiO_2$, $Cr_2O_3$, $Fe_2O_3$, $Al_2O_3$, CuO and/or $P_2O_5$ or the like) being 9 mass %.

The included mass amount of the glass frit with respect to the included mass amount of silver powder in the paste was 5%, and $Al_2O_3$ was used as the sintering inhibitor composition. In Table 2, the sintering inhibitor indicates the mass % of the sintering inhibitor with respect to the total included mass amount of silver powder and the glass frit.

After performing screen printing, the above-noted paste was fired at a temperature of 850° C. for three minutes to fabricate the photovoltaic cell element 10.

Conversion efficiencies of each of a large number of the photovoltaic cell elements 10 were measured. Based on JIS (Japan Industrial Standard) C 8913, the measurement of the conversion efficiency was performed under the irradiation conditions of AM1.5 and 100 mW/cm².

As is clear from Table 2, whereas the paste No. 15 using the glass frit B without adding $Al_2O_3$ as the sintering inhibitor had only a 10.68% conversion efficiency, the paste No. 19 using the glass frit C without adding $Al_2O_3$ as the sintering inhibitor had as much as 13.67% conversion efficiency, so that an improvement was seen. And the pastes Nos. 16, 17, 18, 20, 21, and 22, to which $Al_2O_3$ was added as the sintering inhibitor were founded to have greatly improved electrical characteristics with respect to the paste without $Al_2O_3$ added. In the glass frit C, the pastes No. 20 to No. 22 with $Al_2O_3$ added as the sintering inhibitor an excellent conversion efficiency of over 15%.

Furthermore, the glass frit C was used to make the photovoltaic cell element 10 by changing the included mass amount of $SiO_2$ (however, changing the other components in proportion to the amounts of $SiO_2$ in the glass frit C) and, in the same manner as the Example 1, the adhesion strength of the first output lead-out electrode 5a was measured, the results of observing the peeling condition in the tensile strength tests being shown in Table 3.

TABLE 3

| Paste No. | Amount of Glass Frit $SiO_2$ (mass %) | Amount of $Al_2O_3$ Sintering Inhibitor (mass %) | Adhesion Strength (gf) Average Strength | Adhesion Strength (gf) Minimum Strength | Peeling Condition | Judgment |
| --- | --- | --- | --- | --- | --- | --- |
| 23 | 3.4 | 0 | 117 | 81 | Peeling between or pitting of electrodes | Bad |
| 24 | 3.4 | 3 | 160 | 127 | Peeling or pitting of cell | Good |
| 25 | 4.1 | 0 | 79 | 54 | Peeling between or pitting of electrodes | Bad |
| 26 | 4.1 | 3 | 180 | 135 | Peeling or pitting of cell | Good |
| 27 | 4.8 | 0 | 198 | 176 | Peeling or pitting of cell | Good |
| 28 | 4.8 | 3 | 283 | 223 | Peeling of cell | Good |
| 29 | 5.1 | 0 | 255 | 177 | Peeling of cell | Good |
| 30 | 5.1 | 3 | 325 | 235 | Peeling of cell | Good |

As is clear from the results of the pastes No. 23 to No. 30 in Table 3, by making the included amount of $SiO_2$ in the glass frit greater, both the average strength and the lowest strength of intimate contact became high, and the peeling condition was also good. Moreover, as is clear from the results of the pastes Nos. 24, 26, 28, and 30, by adding $Al_2O_3$ as the sintering inhibitor, a great improvement in the adhesion strength was found in comparison to pastes Nos. 23, 25, 27 and 29.

Example 3

Next, a photovoltaic cell element 10 having the first electrode 5 that was formed using a paste that included the glass frit A and a photovoltaic cell element 10 having the first electrode 5 that was formed using a paste that included the glass frit C were fabricated.

Because it was the same as the example 1, except mainly for the materials of the glass frit in the above-noted pastes and the formation by using only the above-noted paste without

TABLE 2

| Paste No. | Glass Frit | Amount of $Al_2O_3$ Sintering Inhibitor (mass %) | Electrical Characteristics F.F. (—) | Electrical Characteristics Conversion Efficiency (%) |
| --- | --- | --- | --- | --- |
| 15 | B | 0 | 0.539 | 10.68 |
| 16 | B | 1.5 | 0.649 | 13.49 |
| 17 | B | 3 | 0.652 | 13.56 |
| 18 | B | 5 | 0.642 | 13.35 |
| 19 | C | 0 | 0.657 | 13.67 |
| 20 | C | 1.5 | 0.777 | 15.88 |
| 21 | C | 3 | 0.779 | 15.93 |
| 22 | C | 5 | 0.771 | 15.68 | providing the silver plated electrode layer in the first electrode 5, the detailed description will be omitted.

The included mass amount of the glass frit with respect to the included mass amount of a silver powder in the paste was 5%, and $Al_2O_3$ was used as the sintering inhibitor composition. In Table 4, the sintering inhibitor indicates the mass % of the sintering inhibitor with respect to the total included mass amount of silver powder and the glass frit.

An interconnect member made of the copper foil was connected to the electrodes of the fabricated photovoltaic cell element, the front side filler made of an ethylene vinyl acetate (EVA) and a transparent member made of glass were provided at the first surface 9a side, the back side filler made of an EVA and a rear surface protective material made of polyethylene terephthalate (PET) were provided at the second surface 9b side, thereby performing modularization, and a pressure cooker test (PCT) was performed with respect to the modularized photovoltaic cell element, so as to evaluate its reliability. The pressure cooker test was performed under the conditions of a temperature of 125° C., a relative humidity of 95% and a pressure of 2 MPa. Conversion efficiencies at the elapsed times of 300 hours, 350 hours and 400 hours were measured, and the ratios of the conversion efficiencies after the initial conversion efficiency are be shown in Table 4 using by % indication. Based on JIS (Japan Industrial Standard) C 8913, the measurement of the conversion efficiency was performed under the irradiation conditions of AM1.5 and 100 mW/cm².

TABLE 4

| Paste No. | Glass Frit | Amount of $Al_2O_3$ Sintering Inhibitor (mass %) | Ratio of Change in Electrical Characteristics | | |
|---|---|---|---|---|---|
| | | | 300 hours (%) | 350 hours (%) | 400 hours (%) |
| 31 | A | 0 | 81.7 | 57.0 | 42.6 |
| 32 | A | 1.5 | 92.0 | 65.4 | 50.0 |
| 33 | A | 3 | 94.7 | 70.6 | 49.6 |
| 34 | A | 5 | 94.9 | 72.1 | 50.4 |
| 35 | C | 0 | 95.6 | 82.9 | 69.6 |
| 36 | C | 1.5 | 95.5 | 91.4 | 77.7 |
| 37 | C | 3 | 96.7 | 90.8 | 84.3 |
| 38 | C | 5 | 96.2 | 91.5 | 84.6 |

As is clear from Table 4, it was found in the paste using the glass frits A and C that the pastes No. 32 to No. 34 and the pastes No. 36 to No. 38 to which $Al_2O_3$ was added maintained a condition having a high conversion efficiency with respect to the pastes No. 31 and No. 35, to which $Al_2O_3$ was not added as the sintering inhibitor, even after long elapsed time. That is, it was found that, by adding $Al_2O_3$ as the sintering inhibitor, the reliability of the photovoltaic cell element was greatly improved.

It was also found in particular that the pastes No. 36 to No. 38, to which $Al_2O_3$ was added to the glass frit C, maintained a stable condition with a high conversion efficiency with respect to the paste No. 35, to which $Al_2O_3$ was not added as a sintering inhibitor, even after long elapsed time. Although it is not noted in Table 4, as the results of experiments, optimum additive amount of $Al_2O_3$ as the sintering inhibitor in the glass frit C is considered to be within the range of 0.1% to 5%.

| Description of Reference Numerals | |
|---|---|
| 1 | Semiconductor substrate (semiconductor base) |
| 1a | First region |
| 1b | Second region |
| 2 | First semiconductor layer |
| 3 | Second semiconductor layer |
| 4 | Anti-reflection layer |
| 5 | First electrode |
| 5a | First output lead-out electrode |
| 5b | First collector electrode |
| 5c | Auxiliary electrode |
| 6 | Second electrode |
| 6a | Second output lead-out electrode |
| 6b | Second collector electrode |
| 7 | BSF region |
| 9a | First surface |
| 9b | Second surface |
| 10 | Photovoltaic cell element |

The invention claimed is:

1. An electrically conductive paste for a photovoltaic cell, comprising a silver powder, glass frit and a sintering inhibitor that suppresses sintering of the silver powder,
wherein the sintering inhibitor comprises at least one substance selected from among aluminum oxide, silicon oxide, and silicon carbide.

2. The electrically conductive paste according to claim 1, wherein the sintering inhibitor comprises aluminum oxide or silicon oxide.

3. The electrically conductive paste according to claim 1, wherein the glass frit comprises a $Bi_2O_3$—$SiO_2$—ZnO-based glass and the glass substantially does not contain $B_2O_3$.

4. The electrically conductive paste according to claim 1, wherein the content of the sintering inhibitor is at least 1 mass % and no greater than 35 mass with respect to a total content of the silver powder and the glass frit.

5. The electrically conductive paste according to claim 1, wherein the content of the glass frit is at least 11 mass % and no greater than 30 mass % with respect to the content of silver powder.

6. A method for producing a photovoltaic cell element comprising an electrode layer on a semiconductor base, the method comprising:
coating the electrically conductive paste for a photovoltaic cell according to claim 1 onto a semiconductor base; and
forming an electrode layer on the semiconductor base by firing the coated electrically conductive paste.

7. A method for producing a photovoltaic cell element, the method comprising:
forming a first anti-reflection layer on a first region of a main surface of a semiconductor base;
forming a second anti-reflection layer on a second region of the main surface, the second region different from the first region;
coating the electrically conductive paste for a photovoltaic cell according to claim 1 onto the anti-reflection layer on the second anti-reflection layer; and
forming a surface electrode in the second region by reacting the second anti-reflection layer with the electrically conductive paste at an elevated temperature.

8. The method for producing a photovoltaic cell element according to claim 6, wherein the electrode layer thickness is formed to be no greater than 10 μm.

9. The method for producing a photovoltaic cell element according to claim 6, further comprising, forming a conductive layer on the electrode layer by plating.

* * * * *